(12) United States Patent
Stites

(10) Patent No.: US 9,488,811 B2
(45) Date of Patent: Nov. 8, 2016

(54) WYNNE-DYSON OPTICAL SYSTEM WITH VARIABLE MAGNIFICATION

(71) Applicant: Ultratech, Inc., San Jose, CA (US)

(72) Inventor: David G. Stites, St. Petersburg, FL (US)

(73) Assignee: Ultratech, Inc., San Jose, CA (US)

( * ) Notice: Subject to any disclaimer, the term of this patent is extended or adjusted under 35 U.S.C. 154(b) by 277 days.

(21) Appl. No.: 14/341,777

(22) Filed: Jul. 26, 2014

(65) Prior Publication Data

US 2015/0055228 A1  Feb. 26, 2015

Related U.S. Application Data

(60) Provisional application No. 61/867,671, filed on Aug. 20, 2013.

(51) Int. Cl.
*G02B 17/00* (2006.01)
*G02B 15/14* (2006.01)

(52) U.S. Cl.
CPC ..................... *G02B 15/14* (2013.01)

(58) Field of Classification Search
CPC .............................. G02B 21/04; G02B 5/045
USPC .......................................................... 359/727
See application file for complete search history.

(56) References Cited

U.S. PATENT DOCUMENTS

| | | |
|---|---|---|
| 1,401,345 A | 12/1921 | Mechau |
| 1,783,998 A | 12/1930 | Chretien |
| 2,742,817 A | 4/1956 | Altman |
| 4,103,989 A | 8/1978 | Rosin |
| 4,171,870 A | 10/1979 | Bruning et al. |
| 4,391,494 A | 7/1983 | Hershel |
| 4,425,037 A | 1/1984 | Hershel et al. |
| 4,676,631 A | 6/1987 | Kosugi et al. |
| 4,773,748 A | 9/1988 | Shih et al. |
| 4,964,705 A | 10/1990 | Markle |
| 5,031,977 A | 7/1991 | Gibson |
| 5,040,882 A | 8/1991 | Markle |
| 5,161,062 A | 11/1992 | Schafer et al. |
| 5,559,629 A | 9/1996 | Sheets et al. |
| 5,781,346 A | 7/1998 | Allen et al. |

(Continued)

FOREIGN PATENT DOCUMENTS

| | | |
|---|---|---|
| JP | 2001-166497 | 6/2001 |
| JP | 2002-278077 | 9/2002 |

OTHER PUBLICATIONS

J. Dyson, "Unit Magnification Optical System without Seidel Aberrations," *Journal of the Optical Society of America*, Jul. 1959.

(Continued)

*Primary Examiner* — Mahidere Sahle
(74) *Attorney, Agent, or Firm* — Opticus IP Law PLLC

(57) ABSTRACT

A 1× Wynne-Dyson optical system for microlithography having a variable magnification is disclosed. The 1× Wynne-Dyson optical system has first and second prisms, and a positive lens group that includes a split lens having first and second split lens elements that reside adjacent the first and second prisms, respectively. The first and second split lens elements are axially movable to change the magnification by up to about 500 parts per million. An adjustable positive lens group for a 1× Wynne-Dyson optical system is also disclosed, wherein the positive lens group allows for small changes in the optical system magnification.

19 Claims, 9 Drawing Sheets

(56) References Cited

U.S. PATENT DOCUMENTS

| | | |
|---|---|---|
| 5,805,356 A | 9/1998 | Chiba |
| 5,969,803 A | 10/1999 | Mercado |
| 6,381,077 B1 | 4/2002 | Jeong et al. |
| 6,416,908 B1* | 7/2002 | Klosner .................. G03F 7/24 355/47 |
| 6,522,386 B1 | 2/2003 | Nishi |
| 6,560,000 B2 | 5/2003 | Iyer et al. |
| 6,809,888 B1 | 10/2004 | Markle |
| 6,813,098 B2 | 11/2004 | Mercado |
| 6,863,403 B2 | 3/2005 | Mercado et al. |
| 6,879,383 B2 | 4/2005 | Mercado |
| 7,006,197 B2 | 2/2006 | Lee |
| 7,116,496 B1 | 10/2006 | Mercado |
| 7,148,953 B2 | 12/2006 | Mercado |
| 7,177,099 B2 | 2/2007 | Mercado et al. |
| 7,573,655 B2 | 8/2009 | Shafer |
| 2002/0154421 A1 | 10/2002 | Willden |
| 2003/0235682 A1 | 12/2003 | Sogard |
| 2008/0117532 A1 | 5/2008 | Shafer |
| 2012/0063010 A1* | 3/2012 | Mercado ............ G03F 7/70225 359/717 |
| 2013/0321935 A1 | 12/2013 | Stites |

OTHER PUBLICATIONS

Zhang Yudong et al., "A new family of 1:1 catadioptric broadband deep UV high NA lithography lenses," *SPIE* 1463 (1991): 688-694.

R.M.H. New et al., "Analytic optimization of Dyson optics," *Optical Society of America* 31 "Applied Optics," No. 10: 1444-1449.

Zhang et al., "Some Developments for a Unit Magnification Optical System," published by the Optical Society of America, *Applied Optics* 34, No. 7, Mar. 1, 1995.

Flores et al., "Lithographic performance of a new generation i-line optical system: A comparative analysis," *Proc. SPIE* 1927, Optical/Laser Microlithography, 899 (Aug. 8, 1993).

Office Action issued by Japanese Patent Office on Dec. 22, 2015 for Japanese Patent Application Serial No. 2014-0164915, which is a counterpart to the above-identified U.S. Patent Application.

* cited by examiner

| Field | 1X Coordinates | | 1.00041X Magnified Coordinates | |
|---|---|---|---|---|
| | Real X | Real Y | Real X | Real Y |
| | col. 1 | col. 2 | col. 3 | col. 4 |
| A | 5.30000E+001 | 1.80000E+001 | 5.30213E+001 | 1.80072E+001 |
| B | 5.30000E+001 | -1.08306E-007 | 5.30213E+001 | 8.27317E-006 |
| C | 5.30000E+001 | -1.80000E+001 | 5.30213E+001 | -1.80072E+001 |
| D | 0.00000E+000 | -1.80000E+001 | 0.00000E+000 | -1.80072E+001 |
| E | 0.00000E+000 | 0.00000E+000 | 0.00000E+000 | 0.00000E+000 |
| F | 0.00000E+000 | 1.80000E+001 | 0.00000E+000 | 1.80072E+001 |
| G | -5.30000E+001 | 1.80000E+001 | -5.30213E+001 | 1.80072E+001 |
| H | -5.30000E+001 | -1.08306E-007 | -5.30213E+001 | 8.27317E-006 |
| I | -5.30000E+001 | -1.80000E+001 | -5.30213E+001 | -1.80072E+001 |

*FIG. 6*

WYNNE-DYSON OPTICAL SYSTEM WITH VARIABLE MAGNIFICATION

CROSS-REFERENCE TO RELATED APPLICATIONS

This application claims the benefit of priority under 35 U.S.C. §119(e) of U.S. Provisional Application Ser. No. 61/867,671, filed on Aug. 20, 2013, and which is incorporated by reference herein.

FIELD

The disclosure relates to optical systems for microlithography, and in particular to a unit-magnification, catadioptric optical system having a Wynne-Dyson configuration, wherein the optical system has a variable magnification from the nominally unit magnification.

Any and all patents, patent applications and publications cited herein are incorporated by reference herein, including U.S. patent application Ser. No. 13/897,514, entitled "Unit magnification large format catadioptric lens for microlithography," filed on May 20, 2013.

BACKGROUND ART

Photolithography tools are used to print small features on semiconductor (e.g., silicon) wafers in the fabrication of integrated circuits (ICs). Photolithography tools are also used for back-end processes that involve, for example, forming patterns to define layer interconnects. Layer interconnects provide electrical power to drive the IC. The photolithography tools are also used in the back-end process to pattern metal pathways of the high-speed communication bus used to transmit control logic and data input/output (I/O) of the IC.

In the past two decades or so, the size of the silicon wafers used in manufacturing has grown from (200 mm) 8" to (300 mm) 12", with (450 mm) 16" now being considered. The IC manufacturing cost is related to two key factors: yield and throughput (i.e., wafers/hour). When the yield approaches 100%, the IC costs are largely defined by the throughput of the manufacturing process.

One way to increase throughput is to increase the die size on the wafer. Another way is to increase the number of die that can be imaged at one time. To do both, the photolithography tool needs to support multiple-die formats for large die so that the stepping (or scanning) time per wafer is reduced. This is more easily achieved in the coarser back-end layers that can be processed by unit-magnification (1×) photolithography tools.

What is needed is a robust but simple 1× projection optical system for a photolithography tool that operates at the i-line LED wavelength(s) and that has a field size capable of handling four to six die, and that also has a variable magnification that can at least partially compensate for registration errors that can occur in lithographic pattern overlay.

SUMMARY

An aspect of the disclosure is a 1× Wynne-Dyson optical system ("optical system") for microlithography having a variable magnification. The optical system has first and second total-internal-reflection (TIR) prisms, and a positive lens group axially spaced apart from a primary mirror. The positive lens group includes a split lens having first and second split lens elements that reside adjacent the first and second prisms, respectively. The first and second split lens elements are axially movable to change the magnification of the optical system by up to about 500 parts per million.

Another aspect of the disclosure is a Wynne-Dyson microlithographic optical system having a nominal 1× magnification that can be varied. The Wynne-Dyson microlithographic optical system includes along an optical axis: a concave mirror, a positive lens group and first and second TIR prisms. The concave mirror has concave surface. The positive lens group is axially spaced apart from the concave surface of the concave mirror. The first and second TIR prisms are disposed adjacent the positive lens group opposite the concave mirror and on respective sides of the optical axis. Additionally, the positive lens group includes a split lens that defines first and second split lens elements that reside on respective sides of the optical axis and respectively adjacent the first and second TIR prisms. The first and second split lens elements are axially movable to vary the magnification from the nominal 1× magnification by up to about 500 parts per million.

Another aspect of the disclosure is the optical system described above, wherein the microlithographic lens images light over an i-line LED spectrum.

Another aspect of the disclosure is the optical system described above, and having an image field size that is nominally 106 mm by 36 mm.

Another aspect of the disclosure is a microlithographic optical system having a nominal 1× magnification that can be varied, comprising along an optical axis: a concave mirror, a positive lens group, and first and second total-internal-reflection (TIR) prisms, arranged in a Wynne-Dyson configuration; and wherein the positive lens group includes first and second split lens elements that reside adjacent the first and second prisms respectively, the first and second split lens elements being axially movable to vary the magnification from the nominal 1× magnification.

Another aspect of the disclosure is the optical system described above, wherein the variation in magnification is up to about 500 parts per million.

Another aspect of the disclosure is the optical system described above, wherein the first and second split lens elements have a movement range of $\Delta z = \pm 5$ mm.

Another aspect of the disclosure is a method of varying the magnification in a 1× magnification Wynne-Dyson optical system having first and second prisms and a positive lens group arranged relative to an optical axis. The method includes axially moving in opposite directions first and second split lens elements of the positive lens group from a neutral position that defines the 1× magnification to cause a change in the 1× magnification by up to 500 parts per million.

Another aspect of the disclosure is the method described above, wherein axially moving the first and second split lens elements includes moving the first and second split lens elements by up to ±5 mm relative to the neutral position.

Another aspect of the disclosure is a Wynne-Dyson microlithographic optical system having a nominal 1× magnification that can be varied. The optical system includes along an optical axis: a concave mirror having concave surface; a positive lens group spaced apart from the concave surface of the concave mirror; first and second total-internal-reflection (TIR) prisms disposed adjacent the positive lens group opposite the concave mirror and on respective sides of the optical axis; and wherein the positive lens group includes a split lens that defines first and second split lens elements that reside on respective sides of the optical axis and respectively adjacent the first and second TIR prisms, wherein at least one of the first and second split lens elements is axially movable to vary the magnification.

Another aspect of the disclosure is the optical system described above, wherein the first and second split lens elements are axially movable in opposite directions.

Another aspect of the disclosure is the optical system described above, wherein magnification from the nominal 1× magnification is variable by up to 500 parts per million.

Another aspect of the disclosure is the optical system described above, wherein the first and second split lens elements can move axially by up to ±5 mm relative to a neutral position associated with the 1× magnification.

Another aspect of the disclosure is an adjustable positive lens group for a Wynne-Dyson microlithographic optical system having a magnification and that includes first and second prisms operably disposed on opposite sides of an optical axis. The lens groups includes: at least one positive lens element; a split lens that consists of first and second split lens elements that reside on respective sides of the optical axis and respectively operably disposed immediately adjacent the first and second prisms; and wherein at least one of the first and second split lens elements is axially movable to vary the magnification.

Another aspect of the disclosure is the adjustable positive lens group as described above, wherein the at least one positive lens element includes a doublet lens and two single lens elements.

Another aspect of the disclosure is the adjustable positive lens group as described above, wherein each of the first and second split lens elements is axially movable.

Another aspect of the disclosure is the adjustable positive lens group as described above, wherein the first and second split lens elements are formed from sections of a plano-convex lens.

Another aspect of the disclosure is the adjustable positive lens group as described above, wherein the first and second split lens elements are each formed from S-FPL51Y glass Another aspect of the disclosure is the adjustable positive lens group as described above, wherein the optical system has a ray-path intersection point, and wherein the first and second split lens elements reside prism-wise of the ray-path intersection point.

Another aspect of the disclosure is the adjustable positive lens group as described above, wherein the axial movement of at least one of the first and second split lens elements varies the magnification by up to 500 parts per million (ppm).

Another aspect of the disclosure is the adjustable positive lens group as described above, wherein each of the first and second split lens elements can axially move by up to ±5 mm relative to a neutral position.

BRIEF DESCRIPTION OF THE DRAWINGS

FIG. 6 is a table of image field coordinates for both ideal 1× magnification and for a varied magnification of 1.00041×.

DETAILED DESCRIPTION

The claims as set forth below are incorporated into and constitute part of this Detailed Description.

The disclosure relates to lenses for microlithography, and in particular to a unit-magnification catadioptric lens (optical) system having a Wynne-Dyson configuration and used for microlithography, and which is referred to herein as an "optical system" for short. The optical system has a large field for accommodating multiple die, and that has a variable magnification suitable for at least partially compensating for registration errors that can occur in lithography pattern overlay.

The following technical publications and patent documents are incorporated herein by reference:

J. Dyson, "Unit Magnification Optical System without Seidel Aberrations," *Journal of the Optical Society of America*, July 1959.

Zhang Yudong et al., "A new family of 1:1 catadioptric broadband deep UV high NA lithography lenses," *SPIE* 1463 (1991): 688-694.

R. M. H. New et al., "Analytic optimization of Dyson optics," *Optical Society of America* 31 "Applied Optics," no. 10: 1444-1449.

Zhang et al., "Some Developments for a Unit Magnification Optical System," published by the Optical Society of America, *Applied Optics* 34, no. 7, Mar. 1, 1995.

U.S. Pat. Nos. 1,401,345; 1,783,998; 2,742,817; 7,148,593; and 7,573,655.

Figure 1:
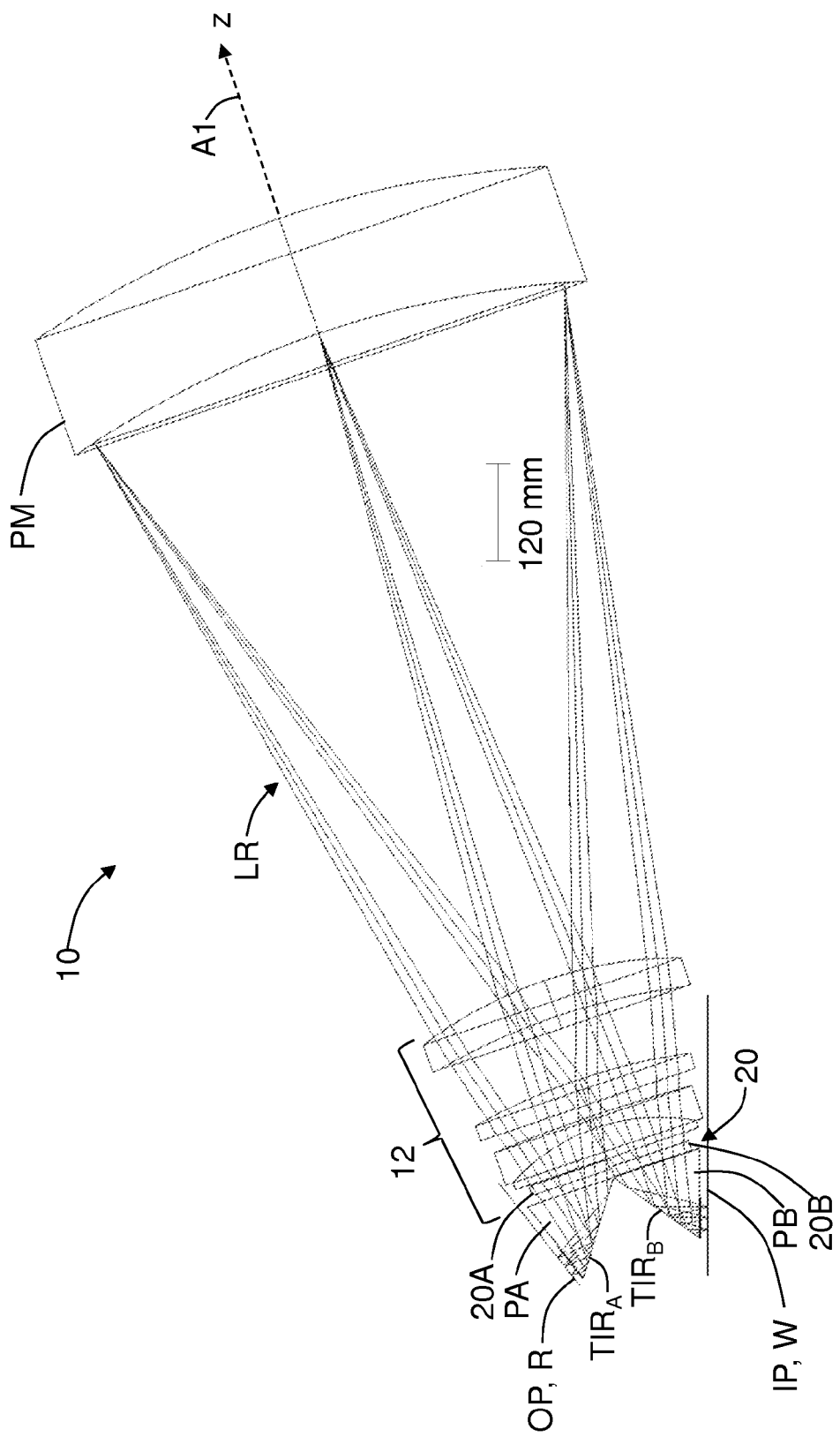
FIG. 1 is an optical diagram of a modified Wynne-Dyson unit-magnification optical system according to the disclosure for use in semiconductor lithography (i.e., photolithography) applications, wherein the optical system includes a positive lens group that has a pair of split lens elements used for magnification adjustment.

FIG. 1 is an optical diagram of a modified Wynne-Dyson unit-magnification (1×) optical system ("optical system") 10 according to the disclosure for use in semiconductor lithography (i.e., photolithography) applications. The optical system 10 includes a split lens (or lens pair) 20 that defines split lens elements 20A and 20B used for magnification adjustment from the nominal system magnification of 1×. Since the variation in magnification is slight (e.g., up to about 500 parts per million (ppm), the optical system overall magnification is nominally 1×. Optical system 10 includes two focal planes, namely an object plane OP and an image plane IP formed as described below. Light rays LR that travel through optical system 10 from the object plane OP to the image plane IP are shown for three field points.

The optical system 10 includes a primary mirror PM arranged along an axis A1 that lies in the z-direction. The optical system 10 also includes a positive lens group 12 axially spaced apart from primary mirror PM and that resides optically between the object plane OP and image plane IP. The positive lens group 12 comprises one or more positive lens elements L (see FIG. 2). The positive lens group 12 has overall positive optical power. The Example positive lens group 12 of optical system 10 shown in FIGS. 1 and 2 includes four lens elements L1 through L4, as well as split lens 20. Various arrangements lens elements L can be used, with a doublet formed by elements L1 and L2 and two singlets L3 and L3 shown by way of example.

The optical system 10 includes a pair of fold prisms PA and PB that reside adjacent positive lens group 12 on the side opposite primary mirror PM. The fold prisms PA and PB reside on opposite sides of axis A1 and are so configured because they separate the two focal planes, i.e., the object plane OP at which a reticle or photomask R is operably arranged, and at the image plane IP, at which a surface of a semiconductor wafer W is arranged. Without fold prisms PA and PB, the two focal planes OP and IP would overlap due to the folded nature of optical system 10. In an example, fold prisms PA and PB have respective surfaces $TIR_A$ and $TIR_B$ that define total-internal-reflection (TIR) surfaces.

Figure 2:
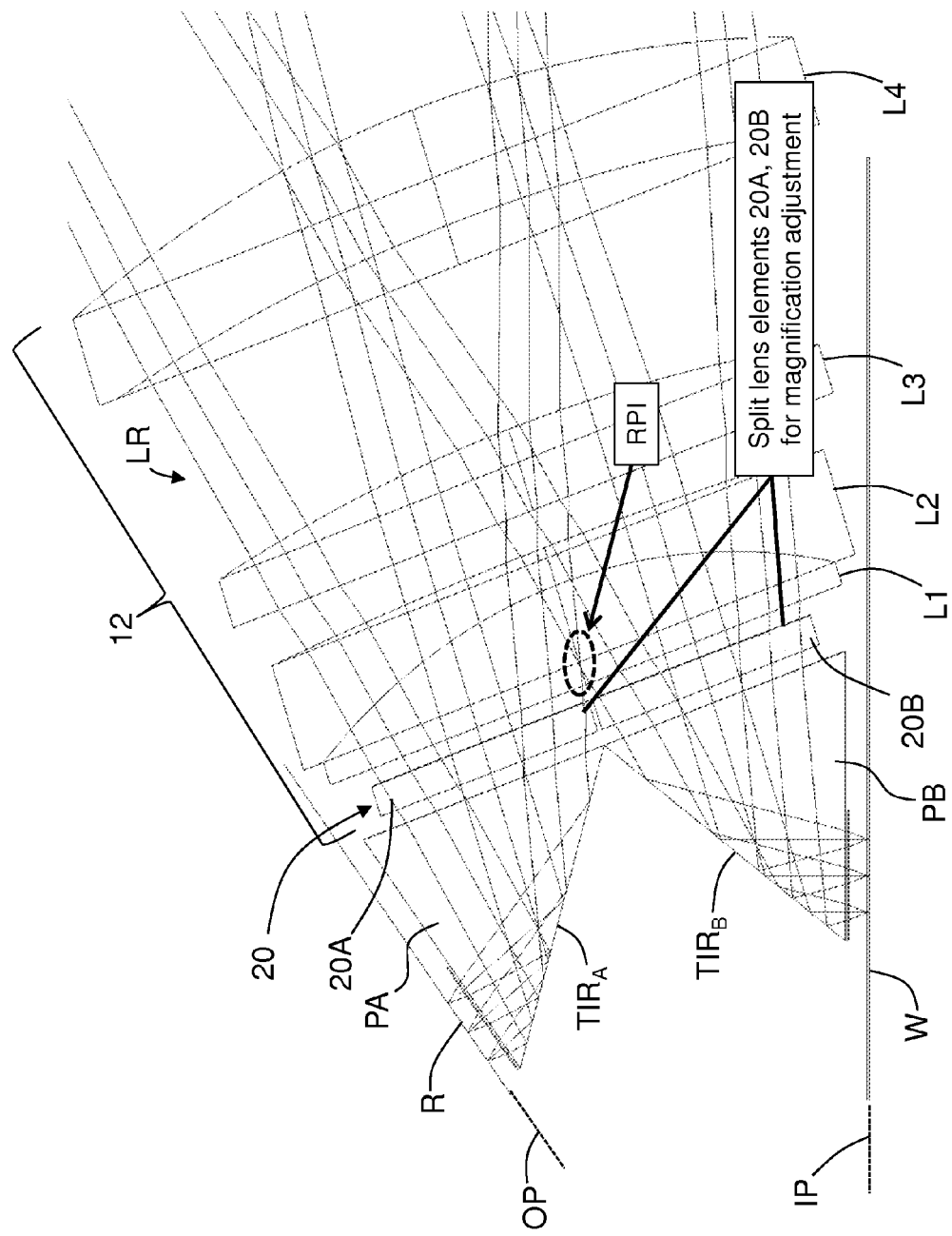
FIG. 2 is a close-up view of a modified version of the optical system of FIG. 1, showing the split lens elements used for magnification adjustment.

The aforementioned FIG. 2 is a close-up view of positive lens group 12 of optical system 10 of FIG. 1, showing the lens pair 20 as constituted by split lens elements 20A, 20B operably arranged to perform magnification adjustment. FIG. 2 also shows exemplary lens elements L1 through L4 of positive lens group 12. The outward going rays LR from the object plane OP and return rays from the primary mirror PM intersect beyond the region occupied by the split lens elements 20A, 20B, i.e., closer to the primary mirror PM, at a ray-path intersection point RPI. Thus, split lens elements 20A and 20B of lens pair 20 can be said to reside prism-wise of ray-path intersection point RPI.

Figure 3:
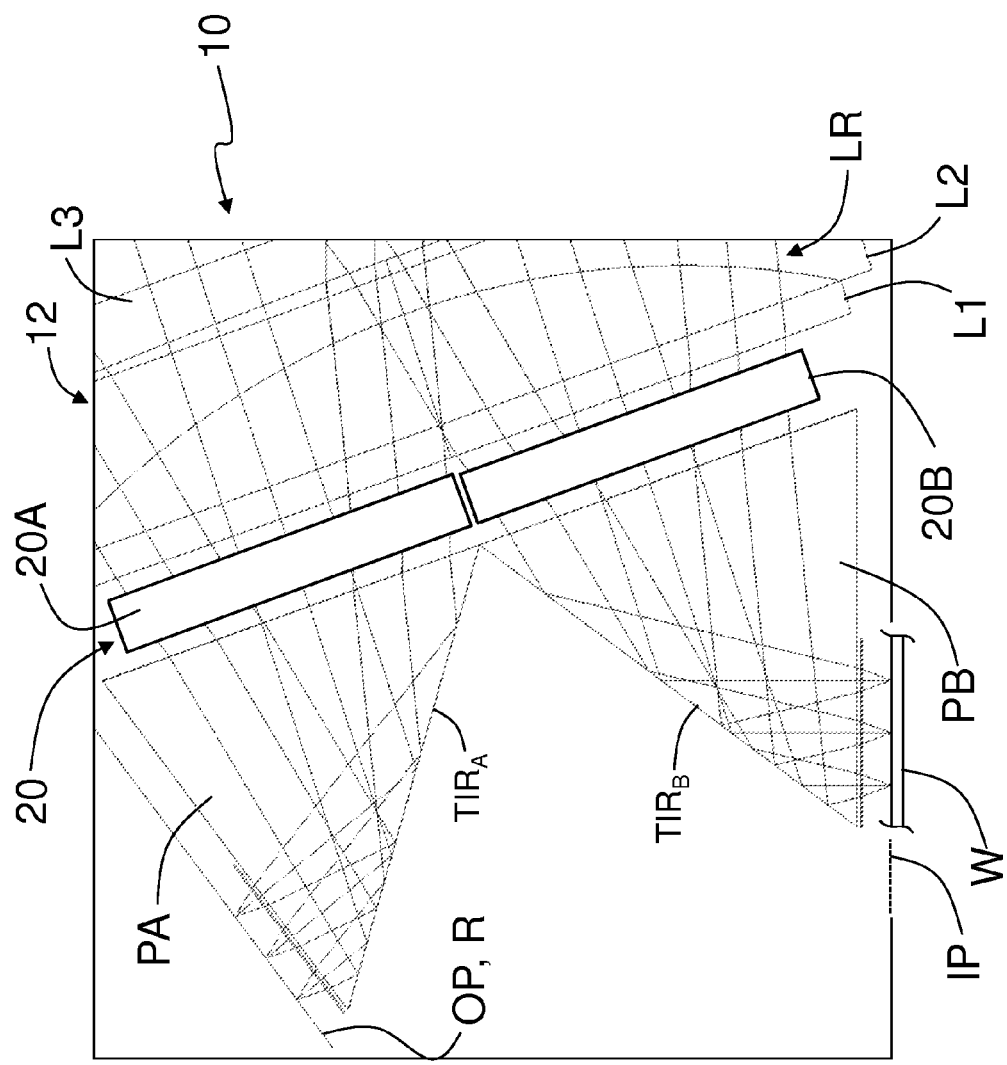
FIG. 3 is an even closer view of pair of split lens elements.

FIG. 3 is an even closer view of the split lens elements 20A, 20B of lens pair 20. In an example, the split lens elements 20A, 20B of lens pair 20 are formed from a (circular) plano-convex lens. In an example, lens pair 20 has a focal length of 25 meters. The focal length of lens pair 20 is determined by the refractive index n of the glass (e.g., Ohara S-FPL51Y with n=1.497 or MIL-497811) in this instance, and a convex radius of curvature $1.28 \times 10^4$ mm (12.8 meters). The lens pair 20 is optimized at 1× magnification in conjunction with other lens elements L in positive lens group 12 to satisfy principal design requirements: NA, field size, spectral range, distortion and image quality as gaged by the MTF and/or the Strehl-Ratio. The optical system 10 is inherently telecentric and symmetrical relative to the primary mirror PM. Therefore, refocusing object and image conjugates does not alter the magnification.

Figure 4:
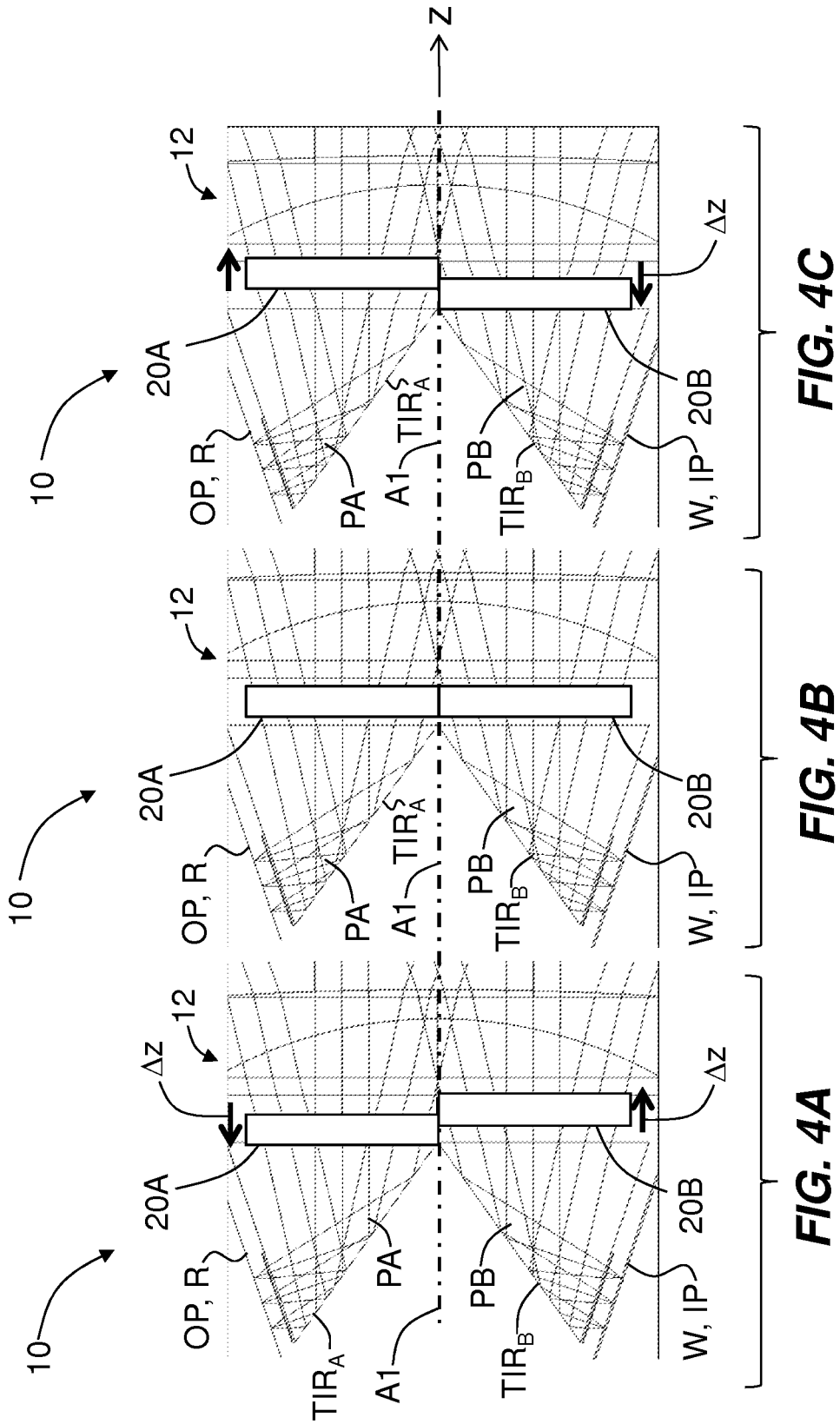
FIGS. 4A-4C are close-up views similar to FIG. 3, illustrating how the magnification of the optical system is varied by axially moving each split lens element in opposite directions.

FIGS. 4A-4C are close-up views similar to FIG. 3, illustrating how the magnification of the optical system 10 is varied by axially moving each split lens element 20A and 20B of lens pair 20 in opposite directions by an amount Δz. In FIG. 4A, split lens element 20A moves to the left of its neutral position (FIG. 4B), while split lens element 20B moves equally in the opposite direction. In FIG. 4C, split lens element 20A moves to the right while split lens element 20B moves to the left. The ratio of Group Focal Lengths (GFL) from the primary mirror PM to the wafer W ($GFL_W$) and from the reticle R to the primary mirror PM ($GFL_R$) determines the magnification ratio: $M=GFL_W/GFL_R$.

By way of example, both split lens elements 20A, 20B are centered in their neutral position (FIG. 4B), the magnification is exactly 1× and the Group Focal Lengths (GFL) are equal $GFL_W=GFL_R=915.5942$ mm. Moving split lens element 20A to the right (farther from the reticle R) decreases the group focal length to $GFL_R=915.4069$ mm, while the group focal to the wafer lengthens to $GFL_W=915.7816$ mm.

The ratio $GFL_W/GFL_R=1.0004094\times$ for which the change in magnification ΔM becomes 409 parts per million (ppm). Hence, image size increases by 0.041%. This imparts an increase of 43×11 microns to a rectangular image format size of 106×28 mm. This slight change from strict unit magnification allows for registration errors that can occur in the lithography process to be at least partially compensated.

In other examples, only one of the split lens elements 20A, 20B is moved relative to the neutral (aligned) position of FIG. 4B that defines the 1× magnification.

Figure 5:
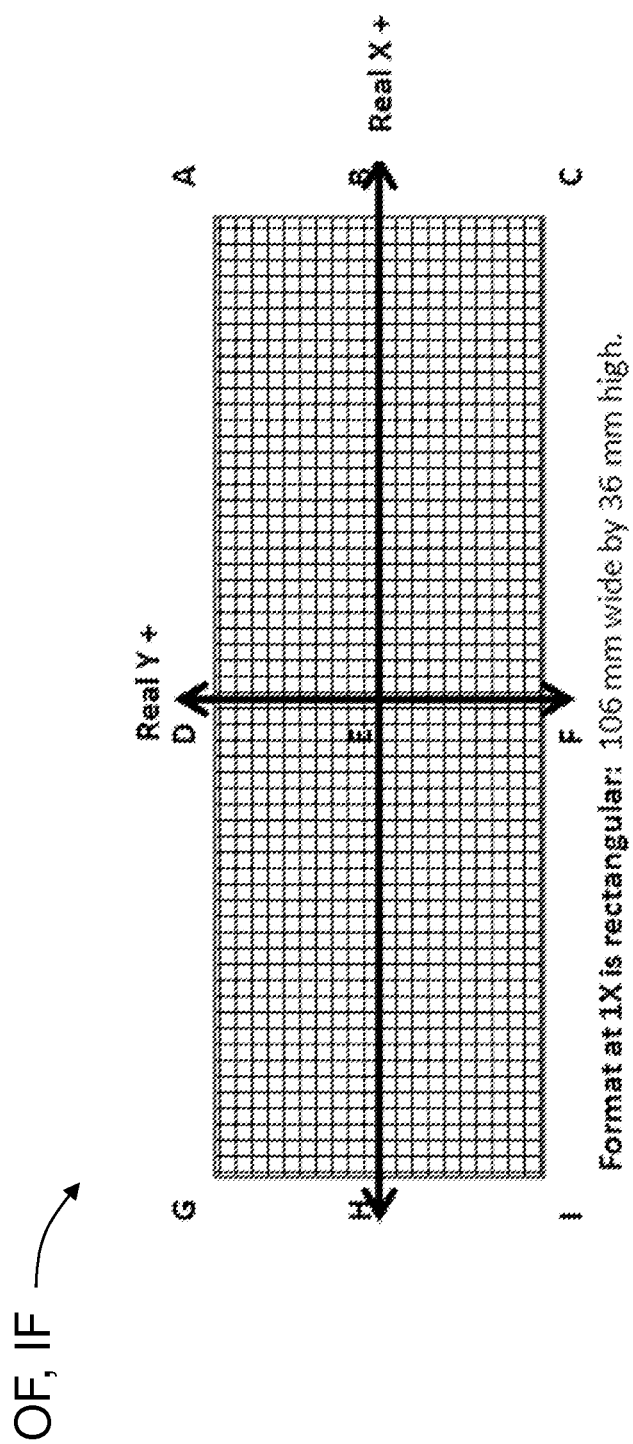
FIG. 5 is a representation of the object and image fields each having a rectangular formal that in an example is nominally 106 mm wide by 36 mm high.

FIG. 5 is a representation of the object and image fields OF and IF each having a rectangular format that in an example is nominally 106 mm wide by 36 mm high. FIG. 6 is a table of image field coordinates for both ideal 1× magnification and for a varied magnification M=1.00041×. The values in Table 6 indicate (x,y) coordinates at four corners and four center edge coordinates around the rectangular border plus the center (0,0) coordinate. The left pair of columns represents when the split lens elements 20A, 20B are aligned so that the magnification of optical system 10 is 1×. The right pair of columns represents the split lens elements 20A, 20B shifted by equal and opposite directions by Δz=±5 mm to produce an increase in magnification wherein M=1.00041×. Reversing the directions of movement of split lenses elements 20A, 20B results in de-magnification wherein M=0.99959×.

Normalized differences between Real X and Y field values in columns 1 and 2 and those in columns 3 and 4 matches the GFL ratio of M=1.00041. A small and tolerable difference attributed to distortion results from having optimized optical system 10 for zero-distortion at the neutral position for the split lens elements 20A and 20B (see FIG. 4B). Absolute size differences are: ±21.3 microns in X and ±7.2 microns in Y, or a total change of 42.6 microns in width and 14.4 microns in height over the respective format dimension. These are small but significant differences that allow for at least partially compensating for registration errors found in lithographic pattern overlay. Reversing the direction of split lens elements 20A and 20B contracts or de-magnifies the image to M=0.9996×, resulting in a smaller image size by: −42.6 microns in width and −14.4 microns in height.

Figures 7A, 7B:
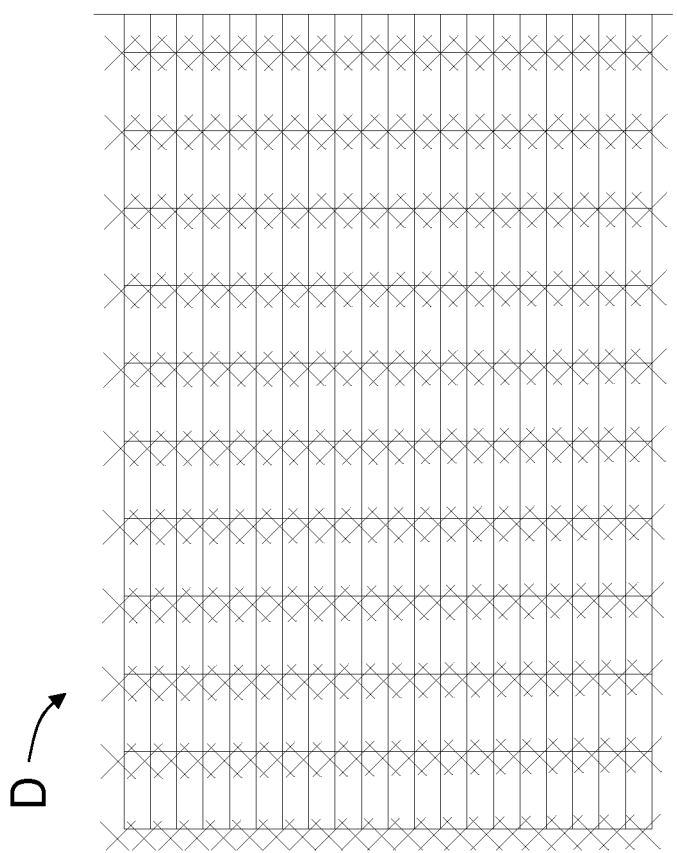
FIGS. 7A and 7B are grid distortion plots, with FIG. 7A showing an enlarged left half of the field and FIG. 7B showing the full field.

FIGS. 7A and 7B are grid plots of the distortion D, with FIG. 7A showing an enlarged left half of the field and FIG. 7B showing the full field. The plots show local distortion error "X's" magnified by a factor of 53,000 so that each small rectangular box spans 100 nm horizontally (X-direction) by 18 nm vertically (Y-direction). Worst-case corner distortion values are <20 nm in X and <10 nm in Y and acceptable. Besides distortion, other practical considerations limit the range of magnification change possible using the systems and methods disclosed herein.

Figure 8:
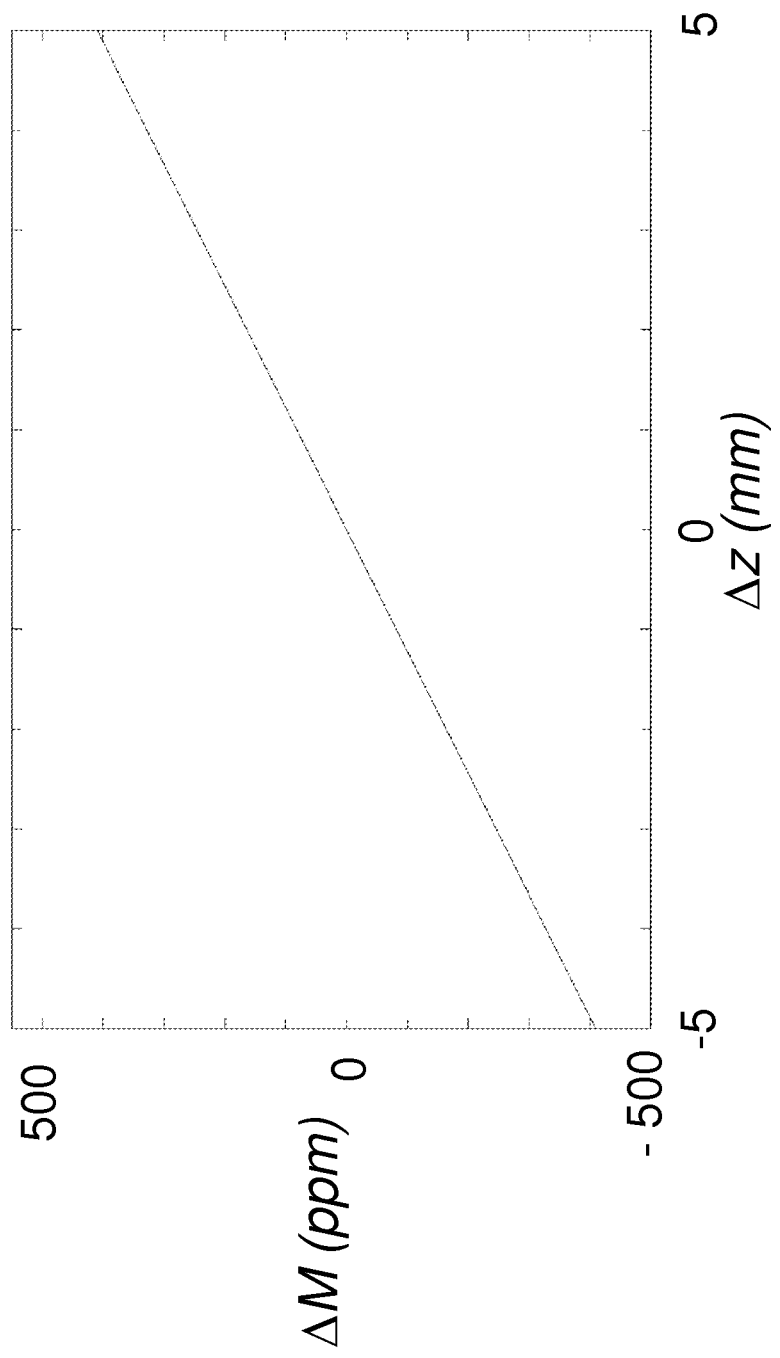
FIG. 8 is a plot of the magnification change $\Delta M$ (ppm) versus the axial shift $\Delta z$ (mm) of the split lens elements.

FIG. 8 is a plot of the magnification change ΔM (ppm) versus the axial shift Δz (mm) of the split lens elements 20A and 20B. The split lens elements 20A and 20B each move by equal and opposite amounts to the limit of Δz=±5 mm, and the range of magnification change is ΔM=±409 ppm, or ±0.000409%.

Figure 9:
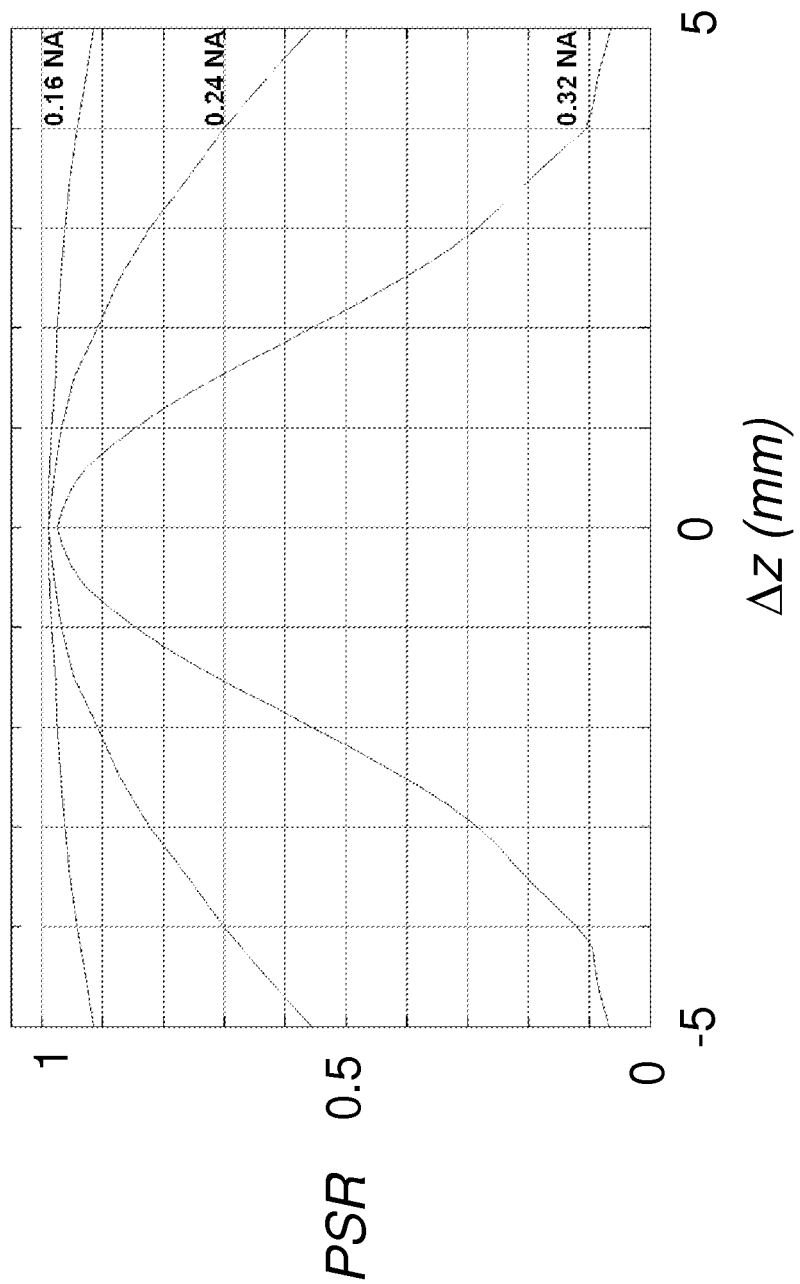
FIG. 9 plots the polychromatic Strehl ratio (PSR) versus the axial shift $\Delta z$ (mm) of the split lens elements for different numerical aperture values of the optical system.

FIG. 9 plots the polychromatic Strehl ratio (PSR) versus the axial shift Δz (mm) of the split lens elements 20A, 20B for different numerical aperture values. The PSR vertical scale ranges from 0 to 1. A value above 0.8 is considered diffraction limited (λ/4 waves RMS). The three curves shown are for Numerical Aperture (NA) values of 0.16, 0.24 and 0.32, respectively. As the NA increases, the PSR falls below useful values in the range of 0.9. For an NA of 0.16, the full ±5 mm range can be utilized. However at larger NAs, the range becomes severely limited to: ±2 mm at 0.24 NA and ±0.7 mm at 0.32 NA. These shift amounts correspond to magnification variations of ΔM=±409 ppm at 0.16 NA, ΔM=±170 ppm at 0.24 NA and ΔM≈±75 ppm at 0.32 NA.

The field size of larger NA systems is smaller than that of smaller NA systems. Assuming a field size of 70 mm×28 mm at 0.32 NA magnification range of ±75 ppm limits the field size change to: ±5.25 μm horizontally and ±2.1 μm vertically.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A Wynne-Dyson microlithographic optical system having a nominal 1× magnification that can be varied, comprising along an optical axis:
   a concave mirror having concave surface;
   a positive lens group axially spaced apart from the concave surface of the concave mirror;
   first and second total-internal-reflection (TIR) prisms disposed adjacent the positive lens group opposite the concave mirror and on respective sides of the optical axis;
   wherein the positive lens group includes a split lens that defines first and second split lens elements that reside on respective sides of the optical axis and respectively adjacent the first and second TIR prisms, the first and second split lens elements being axially movable in opposite directions to vary the magnification from the nominal 1× magnification by up to about 500 parts per million.

2. The Wynne-Dyson microlithographic optical system of claim 1, wherein the microlithographic lens images light over an i-line LED spectrum.

3. The Wynne-Dyson microlithographic optical system of claim 1, having an image field size that is nominally 106 mm by 36 mm.

4. A microlithographic optical system having a nominal 1× magnification that can be varied, comprising along an optical axis:
   a concave mirror, a positive lens group, and first and second total-internal-reflection (TIR) prisms, arranged in a Wynne-Dyson configuration; and
   wherein the positive lens group includes first and second split lens elements that reside adjacent the first and second TIR prisms respectively, the first and second split lens elements being axially movable in opposite directions to vary the magnification from the nominal 1× magnification.

5. The microlithographic optical system of claim 4, wherein the variation in magnification is up to about 500 parts per million.

6. The microlithographic optical system of claim 4, wherein the first and second split lens elements have a movement range of Δz=±5 mm.

7. A method of varying the magnification in a 1× magnification Wynne-Dyson optical system having first and second prisms and a positive lens group arranged relative to an optical axis and having a ray-path intersection point located therein, comprising:
   axially moving in opposite directions first and second split lens elements of the positive lens group from a neutral position that defines the 1× magnification to cause a change in the 1× magnification by up to 500 parts per million, wherein the neutral position is prism-wise of the ray-intersection point.

8. The method of claim 7, wherein axially moving the first and second split lens elements includes moving the first and second split lens elements by up to ±5 mm relative to the neutral position.

9. A Wynne-Dyson microlithographic optical system having a nominal 1× magnification that can be varied and ray-path intersection point, comprising along an optical axis:
   a concave mirror having concave surface;
   a positive lens group spaced apart from the concave surface of the concave mirror and that includes the ray-path intersection point;
   first and second total-internal-reflection (TIR) prisms disposed adjacent the positive lens group opposite the concave mirror and on respective sides of the optical axis;
   wherein the positive lens group includes a split lens that defines first and second split lens elements that reside on respective sides of the optical axis and respectively adjacent the first and second TIR prisms;
   wherein the first and second split lens elements reside prism-wise of the ray-path intersection point; and
   wherein at least one of the first and second split lens elements is axially movable to vary the magnification.

10. The Wynne-Dyson microlithographic optical system of claim 9, wherein the first and second split lens elements are axially movable in opposite directions.

11. The Wynne-Dyson microlithographic optical system of claim 10, wherein magnification from the nominal 1× magnification is variable by up to 500 parts per million.

12. The Wynne-Dyson microlithographic optical system of claim 10, wherein the first and second split lens elements can move axially by up to ±5 mm relative to a neutral position associated with the 1× magnification.

13. An adjustable positive lens group for a Wynne-Dyson microlithographic optical system having a ray-path intersection point, a magnification and first and second prisms operably disposed on opposite sides of an optical axis, comprising:
   at least one positive lens element;
   a split lens that consists of first and second split lens elements that reside on respective sides of the optical axis and respectively operably disposed immediately adjacent the first and second prisms and prism-wise of the ray-path intersection point and of the at least one positive element; and
   wherein at least one of the first and second split lens elements is axially movable to vary the magnification.

14. The adjustable positive lens group of claim 13, wherein the at least one positive lens element includes a doublet lens and two single lens elements.

15. The adjustable positive lens group of claim 13, wherein each of the first and second split lens elements is axially movable.

16. The adjustable positive lens group of claim 13, wherein the first and second split lens elements are formed from sections of a plano-convex lens.

17. The adjustable positive lens group of claim 13, wherein the first and second split lens elements are each formed from S-FPL51Y glass.

18. The adjustable positive lens group of claim 13, wherein the axial movement of at least one of the first and second split lens elements varies the magnification by up to 500 parts per million (ppm).

19. The adjustable positive lens group of claim 13, wherein each of the first and second split lens elements can axially move by up to ±5 mm relative to a neutral position.

\* \* \* \* \*